(12) United States Patent
Jeon

(10) Patent No.: US 11,124,875 B2
(45) Date of Patent: Sep. 21, 2021

(54) ATOMIC LAYER DEPOSITION APPARATUS AND ATOMIC LAYER DEPOSITION METHOD USING THE SAME

(71) Applicant: INDUSTRY-UNIVERSITY COOPERATION FOUNDATION HANYANG UNIVERSITY, Seoul (KR)

(72) Inventor: Hyeongtag Jeon, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 16/280,589

(22) Filed: Feb. 20, 2019

(65) Prior Publication Data

US 2019/0186013 A1    Jun. 20, 2019

Related U.S. Application Data

(63) Continuation of application No. PCT/KR2017/009246, filed on Aug. 24, 2017.

(30) Foreign Application Priority Data

Aug. 26, 2016   (KR) ........................ 10-2016-0108985

(51) Int. Cl.
| | |
|---|---|
| *C23C 16/455* | (2006.01) |
| *C23C 16/54* | (2006.01) |
| *C23C 16/458* | (2006.01) |
| *C23C 16/44* | (2006.01) |

(52) U.S. Cl.
CPC ........ *C23C 16/45551* (2013.01); *C23C 16/44* (2013.01); *C23C 16/455* (2013.01); *C23C 16/4583* (2013.01); *C23C 16/54* (2013.01)

(58) Field of Classification Search
None
See application file for complete search history.

(56) References Cited

U.S. PATENT DOCUMENTS

| | | | | |
|---|---|---|---|---|
| 3,765,763 | A * | 10/1973 | Nygaard | B23Q 41/06 355/100 |
| 2004/0083959 | A1 | 5/2004 | Carpenter et al. | |
| 2012/0225204 | A1* | 9/2012 | Yudovsky | C23C 16/45551 427/248.1 |

(Continued)

FOREIGN PATENT DOCUMENTS

| | | |
|---|---|---|
| JP | 2001254181 A | 9/2001 |
| JP | 2012501537 A | 1/2012 |
| KR | 10-20130142869 A | 12/2013 |

(Continued)

*Primary Examiner* — Karla A Moore

(57) ABSTRACT

An atomic layer deposition apparatus is provided. The apparatus includes a gas supply module for simultaneously providing atomic layer deposition gases including a source gas, a purge gas and a reaction gas on different regions of deposition target substrate, and a stage disposed on a side of the gas supply module and configured to move the deposition target substrate in a linear direction. At least 2 layers of the atomic layer are deposited on the deposition target substrate as moving the deposition target substrate in the linear direction along the stage at 1-cycle.

6 Claims, 12 Drawing Sheets

(56) References Cited

U.S. PATENT DOCUMENTS

2013/0001330 A1* 1/2013 Huang .............. C23C 16/45551
                                                                  239/589

FOREIGN PATENT DOCUMENTS

| KR | 10-20140000447 A | 1/2014 | | |
|---|---|---|---|---|
| KR | 10-20140032074 A | 3/2014 | | |
| KR | 10-20150119005 A | 10/2015 | | |
| WO | 2013191471 A1 | 12/2013 | | |
| WO | WO-2014127363 A1 * | 8/2014 | ....... | C23C 16/45578 |

* cited by examiner

ATOMIC LAYER DEPOSITION APPARATUS AND ATOMIC LAYER DEPOSITION METHOD USING THE SAME

CROSS-REFERENCE TO RELATED APPLICATION

This application is a continuation of pending International Application No. PCT/KR2017/009246, which was filed on Aug. 24, 2017 and claims priority to Korean Patent Application No. 10-2016-0108985, filed on Aug. 26, 2016, in the Korean Intellectual Property Office, the disclosures of which are hereby incorporated by reference in their entireties.

BACKGROUND

1. Field

The present disclosure herein relates to an atomic layer deposition apparatus and an atomic layer deposition method using the same, and more particularly, to an atomic layer deposition apparatus which deposits a high-quality atomic layer using spatial division way and an atomic layer deposition method using the same.

2. Description of the Related Art

Typically, a physical vapor deposition (PVD) method using a physical collision (e.g., a sputtering method) and a chemical vapor deposition (CVD) method using chemical reaction have been applied to form a thin film having a predetermined thickness on a substrate such as a semiconductor substrate or glass substrate.

As design rules of semiconductor devices becomes rapidly finer, a thin film for fine patterns has been required and a step difference of a region for forming the thin file has been increased. Therefore, the use of an atomic layer deposition (ALD) method capable of forming uniformly fine patterns in atomic layer thickness and having superior step coverage have been increased.

The atomic layer deposition method is similar to the chemical vapor deposition method in that they use chemical reaction between gas molecules. The typical CVD method injects a plurality of gas molecules in a process chamber simultaneously to generate reaction products and deposit the reaction products on the substrate, but the atomic layer deposition method injects gas containing one source material in a process chamber to adsorb the source material on a heated substrate and then injects a gas containing another source material in the process chamber to generate chemical reaction between the source materials, and then a product of the chemical reaction is deposited on the substrate surface.

However, the atomic layer deposition method of time division way which has been studied recently has weakness of low productivity. Thus, the inventors of the inventive concepts invented an atomic layer deposition apparatus and an atomic layer deposition method using the same in which high quality of the atomic layer deposited thin film is maintained and productivity is improved.

SUMMARY

Embodiments of the inventive concepts may provide an atomic layer deposition apparatus which guarantees high productivity and provides high quality of a thin film, and an atomic layer deposition method using the same.

Embodiments of the inventive concepts may also provide an atomic layer deposition apparatus which provides an atomic layer deposition environment of spatial division way and which is capable of realizing apparatus miniaturization (footprint reduction), and an atomic layer deposition method using the same.

Embodiments of the inventive concepts may further provide an atomic layer deposition apparatus of rotation type which is capable of preventing mixture of atomic layer deposition gases, and an atomic layer deposition method using the same.

Embodiments of the inventive concepts are not limited to the above.

In an aspect, an atomic layer deposition apparatus may include a gas supply module for simultaneously providing atomic layer deposition gases including a source gas, a purge gas and a reaction gas on different regions of deposition target substrate; and a stage disposed on a side of the gas supply module and configured to move the deposition target substrate in a linear direction. At least 2 layers of the atomic layer may be deposited on the deposition target substrate as moving the deposition target substrate in the linear direction along the stage at 1-cycle.

In an embodiment, the gas supply module may include a source gas supply unit for providing the source gas; first and second purge gas supply units, a first outer purge gas supply unit and a second outer purge gas supply unit for providing the purge gas; and first and second reaction gas supply units for providing the reaction gas. The first outer purge gas supply unit, the first reaction gas supply unit, the first purge gas supply unit, the source gas supply unit, the second purge gas supply unit, the second reaction gas supply unit and the second outer purge gas supply unit may be disposed in order along a linear moving path of the deposition target substrate.

In an embodiment, the gas supply module may include a source gas supply unit for providing the source gas, a purge gas supply unit for providing the purge gas, and a reaction gas supply unit for providing the reaction gas. An exhaust port for exhausting the reaction gas or the source gas may be disposed between the reaction gas supply unit and the purge gas supply unit or between the source gas supply unit and the purge gas supply unit.

In an embodiment, the exhaust port for exhausting the reaction gas may be disposed adjacent to the reaction gas supply unit to exhaust the reaction gas toward an opposite direction from the deposition target substrate, and the exhaust port for exhausting the source gas may be disposed adjacent to the source gas supply unit to exhaust the source gas toward an opposite direction from the deposition target substrate.

In an embodiment, the stage may include first and third rods linearly extending in a first direction and second and fourth rods linearly extending in a second direction, and the first to fourth rods may form a closed path.

In an embodiment, the gas supply module may include sub gas supply modules, and the sub gas supply modules are disposed at regular angles to form a circle. The sub gas supply modules may include gas supply units which are disposed in order of a first reaction gas supply unit for providing the reaction gas, a first purge gas supply unit for providing the purge gas, a source gas supply unit for providing the source gas, a second purge gas supply unit for providing the purge gas, and a second reaction gas supply unit for providing the reaction gas. The sub gas supply modules may simultaneously provide the atomic layer deposition gases including the source gas, the purge gas and the reaction gas on the different regions of the deposition target substrate. The sub gas supply modules may further include outer purge gas supply unit providing the purge gas at both ends of the sub gas supply modules.

In an embodiment, the gas supply module may include sub gas supply modules for providing different source gases from each other, and different kinds of thin films may be formed on the deposition target substrate as moving the deposition target substrate along the stage.

In an aspect, an atomic layer deposition method may include linearly moving a deposition target substrate on a stage formed in a closed path to deposit a first atomic layer on the deposition target substrate by a gas supply module providing an atomic layer deposition gas; and further moving the deposition target substrate to deposit a second atomic layer on the deposition target substrate by the gas supply module. At least 2 layers of the atomic layer may be deposited on the deposition target substrate as moving the deposition target substrate along the closed path at 1 cycle.

In an aspect, an atomic layer deposition method may include a first step of moving a plurality of deposition target substrates including a first deposition target substrate and a second deposition target substrate in a first direction on a stage having a closed path to deposit a first atomic layer on the first deposition target substrate through a first gas supply module and to deposit a second atomic layer on the second deposition target substrate through a second gas supply module spaced apart from the first gas supply module; and a second step of moving the plurality of deposition target substrates in a second direction opposite to the first direction to additionally deposit the first atomic layer on the first deposition target substrate through the first gas supply module and to additionally deposit the second atomic layer on the second deposition target substrate through the second gas supply module.

In an embodiment, the first atomic layer and the second atomic layer may be the same kind of atomic layers.

In an embodiment, the first atomic layer and the second atomic layer may be different kinds of atomic layers.

In an embodiment, the method may further include a third step of moving a plurality of the deposition target substrates in the first direction to deposit the second atomic layer on the first deposition target substrate through the second gas supply module and to deposit a third atomic layer on the second deposition target substrate by a third gas supply module spaced apart from the second gas supply module, after the second step.

In an embodiment, the first atomic layer and the third atomic layer may be the same kind of atomic layers, and a kind of the second atomic layer may be different from that of the first and third atomic layers.

DETAILED DESCRIPTION OF THE EMBODIMENTS

Figure 1:
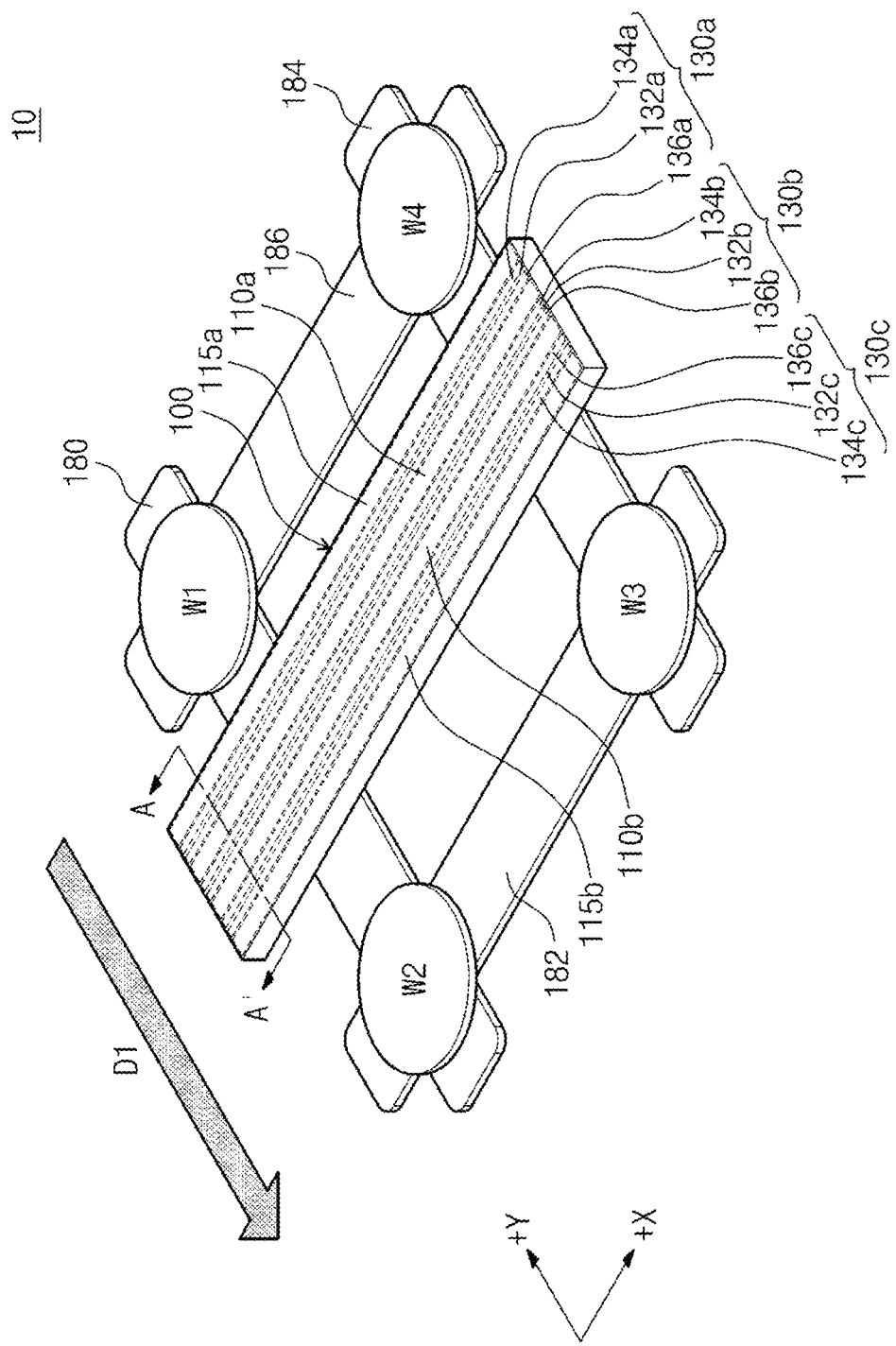
FIG. 1 is a schematic view illustrating an atomic layer deposition apparatus according to a first embodiment of the inventive concepts.

The inventive concepts will now be described more fully hereinafter with reference to the accompanying drawings, in which exemplary embodiments of the inventive concepts are shown. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts.

It will be understood that when an element such as a layer, region or substrate is referred to as being "on" another element, it can be directly on the other element or intervening elements may be present. In addition, in the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. As used herein, the term "and/or" includes any and all combinations of one or more of the associated listed items.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprises", "comprising", "includes", "including", "have", "has" and/or "having" when used herein, specify the presence of stated features, integers, steps, operations, elements, and/or components, but do not preclude the presence or addition of one or more other features, integers, steps, operations, elements, components, and/or groups thereof. Furthermore, it will be understood that when an element is referred to as being "connected" or "coupled" to another element, it may be directly connected or coupled to the other element or intervening elements may be present.

In addition, in explanation of the present invention, the descriptions to the elements and functions of related arts may be omitted if they obscure the subjects of the inventive concepts.

Atomic layer deposition apparatuses according to first to third embodiments of the inventive concepts may form various atomic layers, e.g., at least one of a metal layer, an oxide layer, a nitride layer, a carbide layer, or a sulfide layer. According to an embodiment of the inventive concepts, to form the metal layer, a source gas may be one of tri-methyl aluminum (TMA), tri-ethyl aluminum (TEA) or di-methyl aluminum chloride (DMACI), and a reaction gas may be one of oxygen gas or ozone gas. In this embodiment, a purge gas may be argon, nitrogen, helium, or a mixture of at least two thereof. According to other embodiments, to form a silicon layer, a source gas may be one of silane ($SiH_4$), di-silane ($Si_2H_6$) or tetra-fluoride silicon ($SiF_4$), and a reaction gas may be one of oxygen gas or ozone gas. In this embodiment, a purge gas may be argon, nitrogen, helium, or a mixture of at least two thereof. The source gas, the purge gas and the reaction gas are not limited to the above and are changeable by demands of a person skilled in the art. A first embodiment of the inventive concepts will be described hereinafter with reference to FIGS. 1 and 2.

Figure 2:
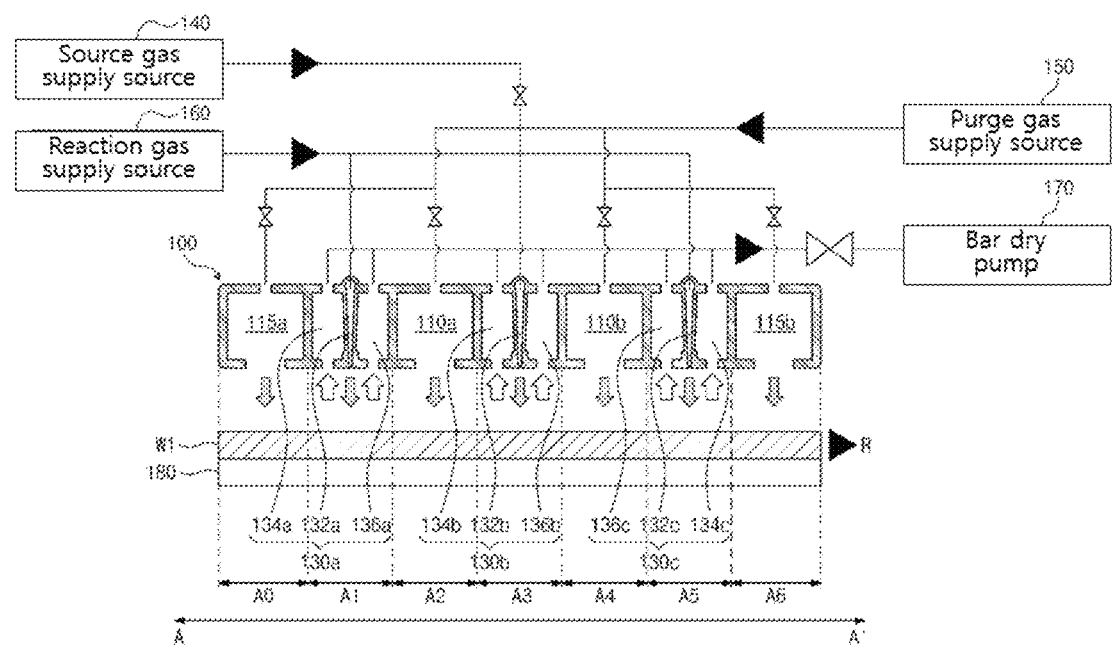
FIG. 2 is a cross-sectional view taken along a line A-A' of FIG. 1 to illustrate the atomic layer deposition apparatus according to the first embodiment of the inventive concepts.

FIG. 1 is a schematic view illustrating an atomic layer deposition apparatus according to a first embodiment of the inventive concepts and FIG. 2 is a cross-sectional view taken along a line A-A' of FIG. 1 to illustrate the atomic layer deposition apparatus according to the first embodiment of the inventive concepts. Particularly, FIG. 2 is a cross-sectional view in which a W1 of FIG. 1 is located under a gas supply module 100.

Referring to FIGS. 1 and 2, an atomic layer deposition apparatus 10 according to the first embodiment of the inventive concepts may include a gas supply module 100 which provides atomic layer deposition gases including a source gas, a purge gas and a reaction gas simultaneously on different regions of a deposition target substrate, and a stage 188 disposed at a side of, for example under, the gas supply module 100 and linearly moving the deposition target substrate (W1, W2, W3 or W4). Hereinafter, each of the components will be described in detail.

Referring to FIG. 1, the gas supply module 100 may be symmetric with respect to a center line of the stage 188, for example, Y-axis or X-axis. The gas supply module 100 may pass through the center line of the stage 188 and may be formed in a single unitary body between an end and the other end of the stage 188. For example, the gas supply module 100 may cover a first rod 180 and a third rod 184 in a width direction.

The stage 188 may include the first rod 180 and the third rod 184 which extend in a direction of the Y-axis, and a second rode 182 and a fourth rod 186 which extend in a direction of the X-axis. The first to fourth rods 180, 182, 184 and 186 may form a closed path. The first to fourth rods 180, 182, 184 and 186 may have a rectangular shape.

A mounting part (not shown) may be disposed on the first to fourth rods 180, 182, 184 and 186 and moved along the first to fourth rods 180, 182, 184 and 186. Thus, the deposition target substrate may be moved along the first to fourth rods 180, 182, 184 and 186 with mounted on the mounting part.

More specifically, the stage 188 may move the deposition target substrates W1, W2, W3 and W4 along the rods 180, 182, 184 and 186 in a linear direction, for example, a −Y-axis direction. Thus, the deposition target substrate may be passed twice under the gas supply module 100 when the deposition target substrate is moved in one-cycle along the rods 180, 182, 184 and 186. Therefore, while the deposition target substrate is passing under the left side and the right side of the gas supply module 100, each atomic layer may be formed on the deposition target substrate.

According to the embodiment, the deposition target substrates W1, W2, W3 and W4 may be moved in respective speeds.

The closed path formed by the rods is described as the rectangular shape in the embodiment of FIG. 1. Alternatively, the closed path may have another shape. The deposition target substrate may have a circular shape. Alternatively, the deposition target substrate may have another shape.

Referring to FIG. 2, the gas supply module 100 according to the first embodiment of the inventive concepts may include a source gas supply unit 132b providing the source gas, first and second purge gas supply units 110a and 110b providing the purge gas, and first and second reaction gas supply units 132a and 132c. The gas supply module 100 may further include a first outer purge gas supply unit 115a and a second outer purge gas supply unit 115b which are disposed at both ends of the gas supply module 100.

According to an embodiment, the source gas supply unit 132b, the first and second purge gas supply units 110a and 119b and the first and second reaction gas supply units 132a and 132c may be disposed along the moving direction of the deposition target substrate.

More specifically, the first outer purge gas supply unit 115a, the first reaction gas supply unit 132a, the first purge gas supply unit 110a, the source gas supply unit 132b, the second purge gas supply unit 110b, the second reaction gas supply unit 132c and the second outer purge gas supply unit 115b may be disposed in the order named.

The first and second outer purge gas supply units 115a and 115b and the first and second purge gas supply units 110a and 110b may receive the purge gas from a purge gas supply source 150 to spray the purge gas toward the deposition target substrate. The source gas supply unit 132b may receive the source gas from a source gas supply source 140 to spray the source gas toward the deposition target substrate. The reaction gas supply units 132a and 132c may receive the reaction gas from a reaction gas supply source 160 to spray the reaction gas toward the deposition target substrate.

An exhaust port exhausting the sprayed reaction gas may be disposed at one side of the first and the second reaction gas supply units 132a and 132c. More specifically, exhaust ports 134a and 136a which exhaust the reaction gas sprayed from the first reaction gas supply unit 132a may be disposed directly adjacent to both sides of the first reaction gas supply unit 132a. The exhaust ports 134a and 136a may collect the sprayed reaction gas in a direction opposite to the spray direction of the reaction gas to prevent the reaction gas from reaching other regions out of a selected region. Exhaust ports 134c and 136c which exhaust the reaction gas sprayed from the second reaction gas supply unit 132c may be disposed directly adjacent to both sides of the second reaction gas supply unit 132c. The exhaust ports 134c and 136c may collect the ejected reaction gas in a direction opposite to the spray direction of the reaction gas to prevent the reaction gas from reaching other regions out of a selected region.

An exhaust port may be disposed at a side of the source gas supply unit 132b to exhaust the sprayed source gas. Exhaust ports 134b and 136b which exhaust the source gas sprayed from the source gas supply unit 132b may be disposed directly adjacent to both sides of the source gas supply unit 132b. The exhaust ports 134b and 136b may collect the sprayed source gas in a direction opposite to the spray direction of the source gas to prevent the source gas from reaching other regions out of a selected region.

According to an embodiment, the exhaust ports 134a, 136a, 134b, 136b, 134c and 136c may be connected to a bar dry pump 170. The reaction gas and/or the source gas, out of a corresponding spatial division region of the substrate, of the reaction gas and/or the source gas sprayed in a top pumping type may be exhausted by operation of the bar dry pump 170.

A method of operating the atomic layer deposition apparatus according to the first embodiment of the inventive concepts will be described hereinafter.

The gas supply units of the gas supply module 100 may respectively provide gases to corresponding spatial division regions simultaneously. For example, the first outer purge gas supply unit 115a may spray the purge gas to an A0 region, the first reaction gas supply unit 132a may spray the reaction gas to an A1 region, the first purge gas supply unit 110a may be spray the purge gas to an A2 region, the source gas supply unit 132b may spray the source gas to an A3 region, the second purge gas supply unit 110b may spray the purge gas to an A4 region, the second region gas supply unit 132c may spray the region gas to an A5 region and the second outer purge gas supply unit 115b may spray the purge gas to an A6 region. These gases may be sprayed simultaneously.

In this case, the exhaust ports 134a and 136a disposed at both sides of the first reaction gas supply unit 132a may exhaust the reaction gas reaching out of the A1 region in the direction opposite with the spray direction of the reaction gas, the exhaust ports 134b and 136b disposed at both sides of the source gas supply unit 132b may exhaust the source gas reaching out of the A3 region in the direction opposite with the spray direction of the source gas, and the exhaust ports 134c and 136c disposed at both sides of the second reaction gas supply unit 132c may exhaust the reaction gas reaching out of the A5 region. Therefore, mixture of the deposition gases may be prevented to provide layers of high quality.

The deposition target substrate W1 may be moved in the D1 direction along the stage 188 and entered under the left end of the gas supply module 100 and then may pass through the A0, A1, A2, A3, A4, A5 and A6 regions in order. Thus, each region of the deposition target substrate W1 may be provided with the source gas, the purge gas, the reaction gas and the purge gas while passing through the A0, A1, A2, A3, A4, A5 and A6 regions. Therefore, an atomic layer may be deposited on the deposition target substrate W1. Specifically, when the deposition target substrate W1 is moving at 1-cycle along the closed loop formed by the rods, the deposition target substrate W1 may be passed twice under the gas supply module 100 and then two atomic layers may be deposited on the deposition target substrate.

Since the deposition target substrate W1 is moved along a linear path, the atomic layer may be deposited uniformly on an entire surface of the deposition target substrate W1. Since the atomic layer deposition gases are provided uniformly regardless of a region of the deposition target substrate W1, the uniform atomic layer may be deposited on the deposition target substrate W1.

Further, the atomic layer deposition apparatus according to the first embodiment of the inventive concepts may provide successive atomic layer deposition processes. A supplying time of the reaction gas may be about twice as long as a supply time of the source gas in order to deposit the atomic layer smoothly. This is because time is necessary to react the source gas and the reaction gas on the deposition target substrate. According to the first embodiment of the inventive concepts, the deposition target substrate passed through the source gas supply unit over the first rod may pass through the second reaction gas supply unit over the first rod, and the deposition target substrate may be further moved to pass through the reaction gas supply unit of the gas supply module over the third rod. In other words, the gas supply module over the third rod may additionally spray the reaction gas to the deposition target substrate provided with the source gas and the reaction gas by the gas supply module over the first rod, thereby providing sufficient process time for the reaction gas deposition. As a result, a high-quality thin film may be provided and the deposition target substrate may be successively moved, and thus productivity may be improved.

The atomic layer deposition apparatus according to the first embodiment of the inventive concepts may minimize gas mixture, caused by movement of the deposition target substrate, by the first and the second outer purge gas supply units 115a and 115b. The first outer purge gas supply unit 115a may be disposed outside the first reaction gas supply unit 132a to prevent the reaction gas sprayed by the first reaction gas supply unit 132a from being provided to the outside of the gas supply module 100. The second outer purge gas supply unit 115b may be disposed outside the second reaction gas supply unit 132c to prevent the reaction gas sprayed by the second reaction gas supply unit 132c from being provided to the outside of the gas supply module 100. Therefore, the purge gas may prevent the reaction gas from being provided in an unexpected direction even if a gas current occurs by movement of the deposition target substrate. In other words, the reaction gas sprayed from the gas supply module over the first rod may be prevented from flowing to other regions, for example, the gas supply module over the third rod. Thus, the atomic layer deposition apparatus according to the first embodiment of the inventive concepts may minimize gas mixture, thereby providing a high-quality atomic layer.

Further, the atomic layer deposition apparatus according to the first embodiment of the inventive concepts may mount and move a plurality of deposition target substrates, and thus the spatial division type atomic layer deposition process may be performed. Conventional spatial division type atomic layer deposition apparatuses may require additional spaces such as a loading space, a deposition space and an unloading space for the deposition target substrate. However, according the first embodiment of the inventive concepts, required space may be significantly reduced to achieve miniaturization of the apparatus i.e., footprint.

The atomic layer deposition apparatus according to the first embodiment of the inventive concepts was described above with reference to FIGS. 1 and 2. A atomic layer deposition apparatus according to a second embodiment of the inventive concepts will be described hereinafter with reference to FIGS. 3 and 4.

Figure 3:
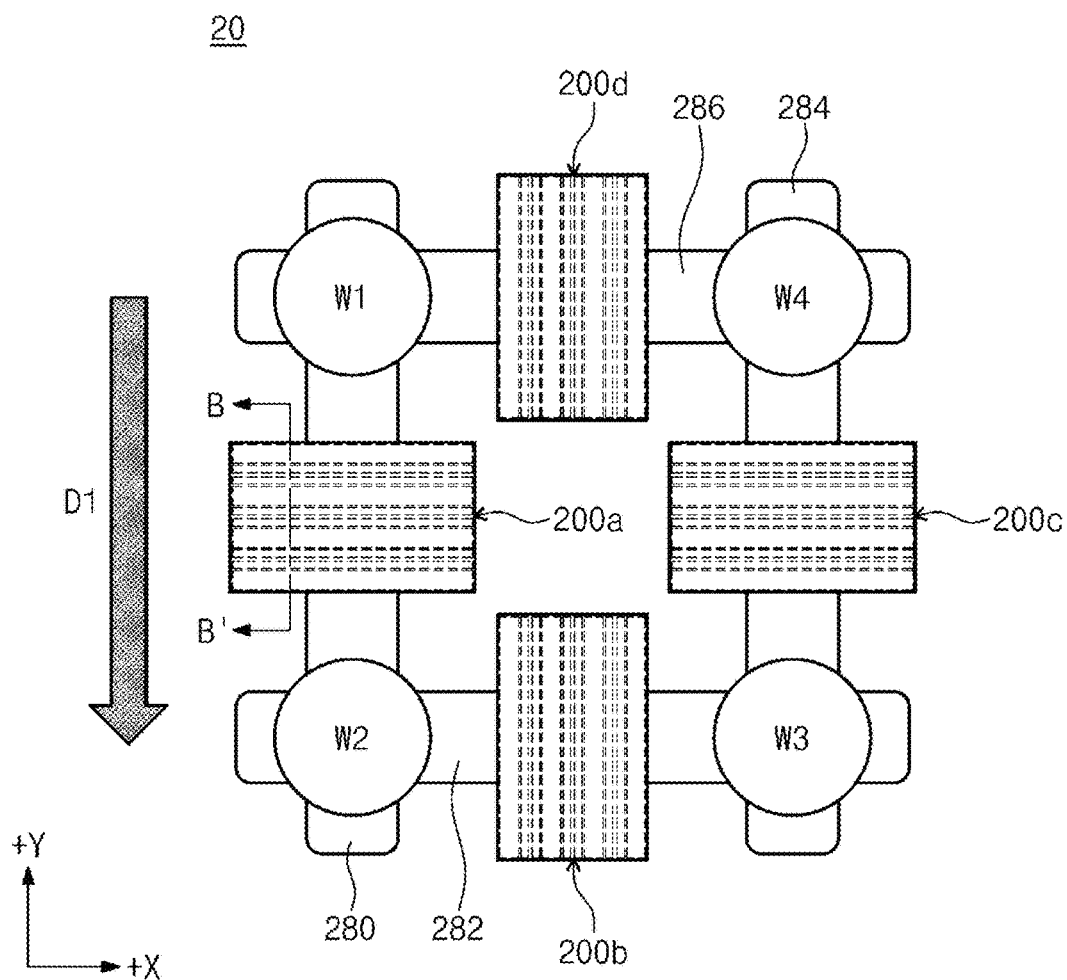
FIG. 3 is a schematic view illustrating an atomic layer deposition apparatus according to a second embodiment of the inventive concepts.
Figure 4:
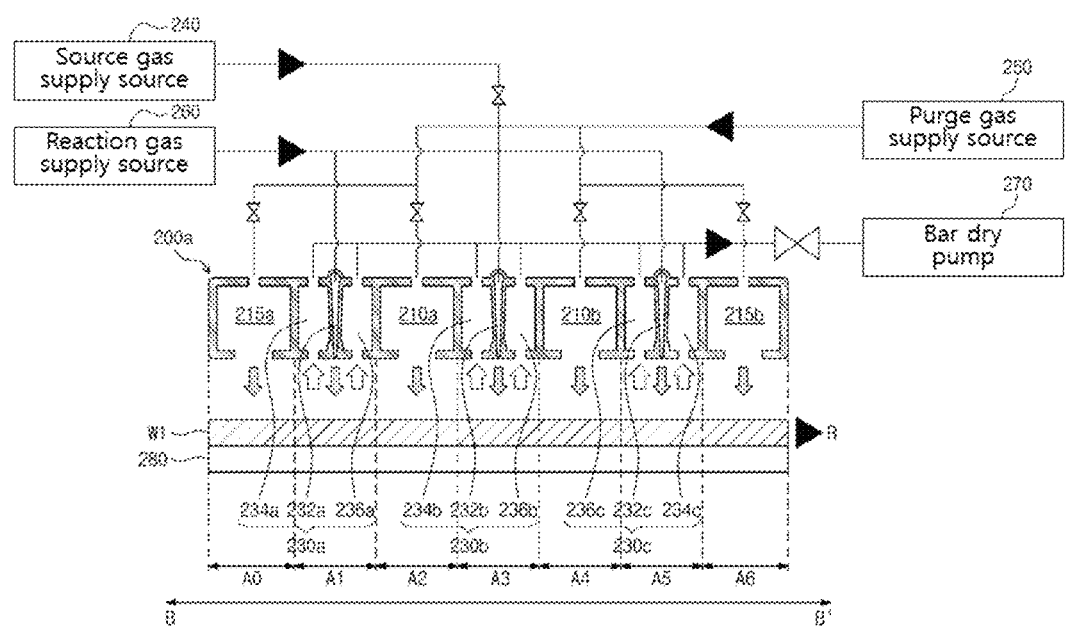
FIG. 4 is a cross-sectional view taken along a line B-B' of FIG. 3 to illustrate the atomic layer deposition apparatus according to the second embodiment of the inventive concepts.

FIG. 3 is a schematic view illustrating an atomic layer deposition apparatus according to a second embodiment of the inventive concepts and FIG. 4 is a cross-sectional view taken along a line B-B' of FIG. 3 to illustrate the atomic layer deposition apparatus according to the second embodiment of the inventive concepts.

Referring to FIG. 3, an atomic layer deposition apparatus 20 according to the second embodiment of the inventive concepts may include a gas supply module which is composed of first to fourth sub gas supply modules 200a, 200b, 200c and 200d. The sub gas supply modules 200a, 200b, 200c and 200d may be disposed symmetrically with respect to a center line of a stage 288. For example, the sub gas supply modules 200a, 200b, 200c and 200d may be arranged in a circle form at intervals of 90 degrees. Hereinafter, the sub gas supply module will be referred as a gas supply module for the purpose of ease and convenience in explanation.

The first to fourth gas supply modules 200a, 200b, 200c and 200d may deposit the same kind or different kinds of atomic layers. For example, the first and the third gas supply modules 200a and 200c may provide an atomic layer deposition gas for depositing an atomic layer of which a kind is different from that of an atomic layer deposited by the second and the fourth gas supply modules 200b and 200d. Alternatively, the first to fourth gas supply modules 200a, 200b, 200c and 200d may provide deposition gases for depositing the same kind of atomic layers.

The stage 288 may include a first rod 280 and a third rod 284 which are extended in a direction of the Y-axis, and a second rode 282 and a fourth rod 286 which are extended in a direction of the X-axis. The first to fourth rods 280, 282, 284 and 286 may form a closed path. The first to fourth rods 280, 282, 284 and 286 may have a rectangular shape. The first gas supply module 200a may be extended in a width direction of the first rod 280, the second gas supply module 200b may be extended in a width direction of the second rod 282, the third gas supply module 200c may be extended in a width direction of the third rod 284, and the fourth gas supply module 200d may be extended in a width direction of the fourth rod 286.

A mounting part (not shown) may be disposed on the first to fourth rods 280, 282, 284 and 286 to circulate along the first to fourth rods 280, 282, 284 and 286. Thus, the deposition target substrate may be moved along the first to fourth rods 280, 282, 284 and 286 while being mounted on the mounting part.

More specifically, the stage 288 may move the deposition target substrates W1, W2, W3 and W4 along the rods 280, 282, 284 and 286 in a linear direction, for example, a −Y-axis direction. When the deposition target substrate is moved at 1-cycle along the rods 280, 282, 284 and 286 to pass the gas supply modules 200a, 200b, 200c and 200d, four atomic layers may be deposited.

According to the embodiment, the deposition target substrates W1, W2, W3 and W4 may be moved in respective speeds.

In the embodiment of FIG. 3, four deposition target substrates are mounted on the stage 288. Alternatively, three or less or five or more deposition target substrates may be mounted on the stage 288. The stage 288 has the rectangular shape in the embodiment of FIG. 3. Alternatively, the stage 288 may have another shape.

The first to fourth gas supply modules 200a, 200b, 200c and 200d are disposed at different locations but are corresponding components to each other. The first gas supply module 200a will be described as the representative hereinafter.

Referring to FIG. 4, the first gas supply module 200a may include a source gas supply unit 232b for providing a source gas, first and second purge gas supply units 210a and 210b for providing a purge gas, first and second reaction gas supply units 232a and 232c for providing a reaction gas. The first gas supply module 200a may further include a first outer purge gas supply unit 215a and a second outer purge gas supply unit 215b which are disposed at both ends of the first gas supply module 200a According to an embodiment, the source gas supply unit 232b, the first and second purge gas supply units 210a and 210b and the first and second reaction gas supply units 232a and 232c may be disposed along the moving direction of the deposition target.

More specifically, the first outer purge gas supply unit 215a, the first reaction gas supply unit 232a, the first purge gas supply unit 210a, the source gas supply unit 232b, the second purge gas supply unit 210b, the second reaction gas supply unit 232c and the second outer purge gas supply unit 215b may be disposed in the order named.

The first and second outer purge gas supply units 215a and 215b and the first and second purge gas supply units 210a and 210b may receive the purge gas from a purge gas supply source 250 to spray the purge gas toward the deposition target substrate. The source gas supply unit 232b may receive the source gas from a source gas supply source 240 to spray the source gas toward the deposition target substrate. The first and second reaction gas supply units 232a and 232c may receive the reaction gas from a reaction gas supply source 260 to spray the reaction gas toward the deposition target substrate.

An exhaust port exhausting the sprayed reaction gas may be disposed at one side of the first and the second reaction gas supply units 232a and 232c. More specifically, exhaust ports 234a and 236a which exhaust the reaction gas sprayed from the first reaction gas supply unit 232a may be disposed directly adjacent to both sides of the first reaction gas supply unit 232a. The exhaust ports 234a and 236a may collect the sprayed reaction gas in a direction opposite to the spray direction of the reaction gas to prevent the reaction gas from reaching other regions out of a selected region. Exhaust ports 234c and 236c which exhaust the reaction gas sprayed from the second reaction gas supply unit 232c may be disposed directly adjacent to both sides of the second reaction gas supply unit 232c. The exhaust ports 234c and 236c may collect the ejected reaction gas in a direction opposite to the spray direction of the reaction gas to prevent the reaction gas from reaching other regions out of a selected region.

An exhaust port may be disposed at a side of the source gas supply unit 232b to exhaust the sprayed source gas. Exhaust ports 234b and 236b which exhaust the source gas sprayed from the source gas supply unit 232b in an opposite direction to the direction of the source gas spray may be disposed directly adjacent to both sides of the source gas supply unit 230b. The exhaust ports 234b and 236b may collect the sprayed source gas in a direction opposite to the spray direction of the source gas to prevent the source gas from reaching other regions out of a selected region.

According to an embodiment, the exhaust ports 234a, 236a, 234b, 236b, 234c and 236c may be connected to a bar dry pump 270. The reaction gas and/or the source gas, out of a corresponding spatial division region of the substrate, of the sprayed reaction gas and/or source gas may be exhausted by operation of the bar dry pump 270.

A method of operating the atomic layer deposition apparatus according to the second embodiment of the inventive concepts will be described hereinafter.

The gas supply units of the first gas supply module 200a may respectively provide gases to corresponding spatial division regions simultaneously. For example, the first outer purge gas supply unit 215a may spray the purge gas to an A0 region, the first reaction gas supply unit 232a may spray the reaction gas to an A1 region, the first purge gas supply unit 210a may be spray the purge gas to an A2 region, the source gas supply unit 232b may spray the source gas to an A3 region, the second purge gas supply unit 210b may spray the purge gas to an A4 region, the second region gas supply unit 232c may spray the region gas to an A5 region and the second outer purge gas supply unit 215b may spray the purge gas to an A6 region.

In this case, the exhaust ports 234a and 236a disposed at both sides of the first reaction gas supply unit 232a may exhaust the reaction gas reaching out of the A1 region, the exhaust ports 234b and 236b disposed at both sides of the source gas supply unit 232b may exhaust the source gas reaching out of the A3 region, and the exhaust ports 234c and 236c disposed at both sides of the second reaction gas supply unit 232c may exhaust the reaction gas reaching out of the A5 region. Therefore, mixture of the deposition gases may be prevented to provide layers of high quality.

The second to fourth gas supply modules 200b, 200c and 200d may be operated by the same method as the first gas supply module 200a.

The deposition target substrate W1 may be moved in the D1 direction and entered under the first gas supply module 200a and then may pass through the A0, A1, A2, A3, A4, A5 and A6 regions in order. Thus, each region of the deposition target substrate W1 may be provided with the source gas, the purge gas, the reaction gas and the purge gas while passing the A0, A1, A2, A3, A4, A5 and A6 regions. Therefore, an atomic layer may be deposited on the deposition target substrate W1.

Specifically, if the deposition target substrate W1 is moving at 1-cycle along the rods 280, 282, 284 and 286, the deposition target substrate W1 may be passed under the first to fourth gas supply modules 200a, 200b, 200c and 200d, and thus four atomic layers may be deposited on the deposition target substrate.

Since the deposition target substrate W1 is moved along a linear path, the atomic layer may be deposited uniformly on an entire surface of the deposition target substrate W1. Since the atomic layer deposition gases are provided uniformly regardless of region of the deposition target substrate W1, the uniform atomic layer may be deposited on the deposition target substrate W1.

Further, the atomic layer deposition apparatus according to the second embodiment of the inventive concepts may provide successive atomic layer deposition processes. A supplying time of the reaction gas may be about twice as long as a supply time of the source gas in order to deposit the atomic layer smoothly. This is because time is necessary to react the source gas and the reaction gas on the deposition target substrate. According to the second embodiment of the inventive concepts, the deposition target substrate which was passed through the source gas supply unit of the first gas supply module may be passed through the second reaction gas supply module of the first gas supply module. Thereafter, the deposition target substrate may move to pass the first reaction gas supply module of the second gas supply module. Thus, sufficient process time may be provided to deposit the reaction gas because the second gas supply module sprays additional reaction gas on the deposition target substrate which was provided with the source gas and the reaction gas from the first gas supply module. Thus, high quality thin film may be provided and the deposition target substrate may be successively moved to improve productivity.

The atomic layer deposition apparatus according to the second embodiment of the inventive concepts may minimize gas mixture, caused by movement of the deposition target substrate, by using the first and second outer purge gas supply units 215a and 215b. The first outer purge gas supply unit 215a may be disposed outside the first reaction gas supply unit 232a to prevent the reaction gas sprayed by the first reaction gas supply unit 232a from being provided to the outside of the gas supply module 200a. The second outer purge gas supply unit 215b may be disposed outside the second reaction gas supply unit 232c to prevent the reaction gas sprayed by the second reaction gas supply unit 232c from being provided to the outside of the first gas supply module 200a. Therefore, the purge gas may prevent the reaction gas from being provided in an unexpected direction even if gas current is occurred by movement of the deposition target substrate. For example, the reaction gas sprayed from the first gas supply module 200a may be prevented from flowing to the second to fourth gas supply modules 200b, 200c and 200d. As a result, the atomic layer deposition apparatus according to the second embodiment of the inventive concepts may minimize gas mixture, and thus the high-quality atomic layer may be provided.

Further, the atomic layer deposition apparatus according to the second embodiment of the inventive concepts may mount and move a plurality of deposition target substrates, and thus the spatial division type atomic layer deposition may be performed. Conventional spatial division type atomic layer deposition apparatuses may require additional spaces such as a loading space, a deposition space and an unloading space for the deposition target substrate. However, according to the second embodiment of the inventive concepts, a required space may be reduced to achieve miniaturization of the apparatus i.e., footprint.

The atomic layer deposition apparatus according to the second embodiment of the inventive concepts was described above with reference to FIGS. 3 and 4. An atomic layer deposition apparatus according to a third embodiment of the inventive concepts will be described hereinafter with reference to FIG. 5.

Figure 5:
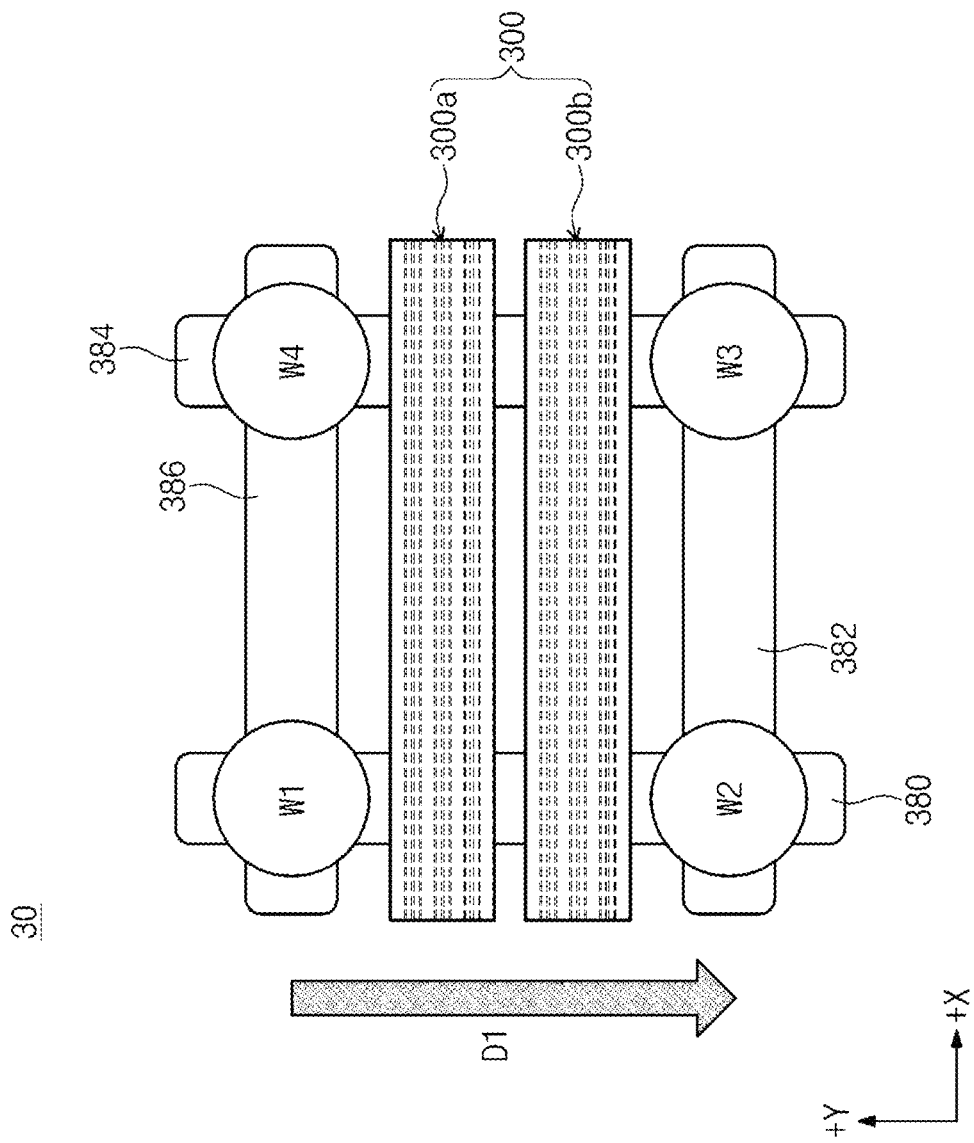
FIG. 5 is a schematic view illustrating an atomic layer deposition apparatus according to a third embodiment of the inventive concepts.

FIG. 5 is a schematic view illustrating an atomic layer deposition apparatus according to a third embodiment of the inventive concepts.

Referring to FIG. 5, a gas supply module 300 of an atomic layer deposition apparatus 30 according to the third embodiment of the inventive concepts may include a first gas supply module 300a and a second gas supply module 300b adjacent to the first gas supply module 300a.

The elements of the first and the second gas supply modules 300a and 300b may correspond to those described with reference to the first and the second embodiments. In the first and second gas supply module 300a and 300b, a first outer purge gas supply unit, a first reaction gas supply unit, a first purge gas supply unit, a source gas supply unit, a second purge gas supply unit, a second reaction gas supply unit and a second outer purge gas supply unit may be arranged adjacent to each other. Exhaust ports may be disposed at both sides of the first and second reaction gas supply unit and the source gas supply unit. Detailed descriptions thereto will be omitted.

According to the third embodiment of the inventive concepts, as the deposition target substrate is moving at 1-cycle along the rods 380, 382, 384 and 386, the deposition target substrate may be passed through a left part of the first and second gas supply modules 300a and 300b and a right part of the first and the second gas supply modules 300a, 300b, 300c and 300d, and thus four atomic layers may be deposited on the deposition target substrate.

The third embodiment of the inventive concepts is different from the first embodiment of the inventive concepts because the gas supply modules of the first embodiment of the inventive concepts are adjacently arranged in the third embodiment. The third embodiment of the inventive concepts may be applied to the second embodiment of the inventive concepts. In this case, as the deposition target substrate is moving at 1-cycle, eight atomic layers may be deposited.

The third embodiment of the inventive concepts was described with reference to FIG. 5. An atomic layer deposition method according to a first embodiment of the inventive concepts will be described hereinafter with reference to FIG. 6.

Figure 6:
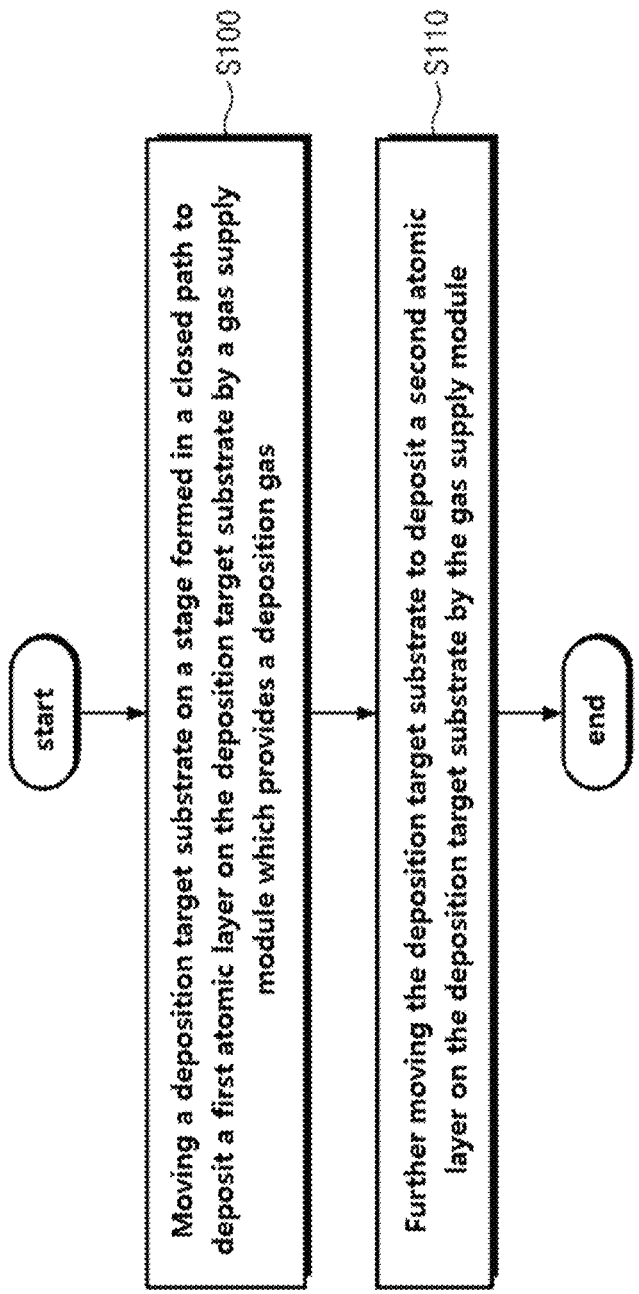
FIG. 6 is a flowchart illustrating an atomic layer deposition method according to a first embodiment of the inventive concepts.

FIG. 6 is a flowchart illustrating an atomic layer deposition method according to a first embodiment of the inventive concepts and FIGS. 7 and 8 are views illustrating the atomic layer deposition method according to the first embodiment of the inventive concepts. Particularly, FIGS. 7 and 8 are views illustrating an atomic layer deposition method according to the first embodiment using the atomic layer deposition apparatus according to the first embodiment of the inventive concepts.

Referring to FIG. 6, the atomic layer deposition method according to the first embodiment of the inventive concepts may include moving a deposition target substrate on a stage formed in a closed path to deposit a first atomic layer on the deposition target substrate by a gas supply module which provides an atomic layer deposition gas (S100), and further moving the deposition target substrate to deposit a second atomic layer on the deposition target substrate by the gas supply module (S110). For the purpose of ease and convenience in explanation, it will be explained on the basis of the deposition target substrate W1.

Figure 7A:
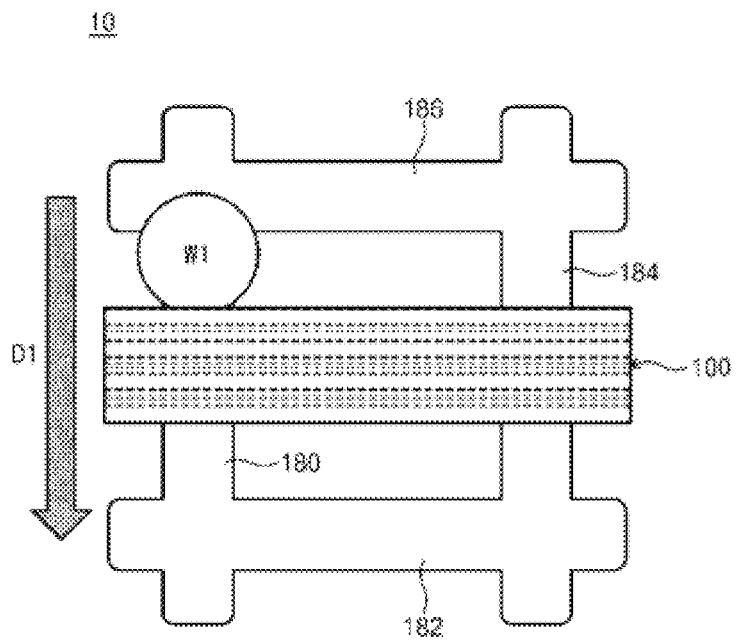
FIGS. 7A, 7B, 8A and 8B are schematic views specifically illustrating an atomic layer deposition method according to the first embodiment of the inventive concepts.
Figure 7B:
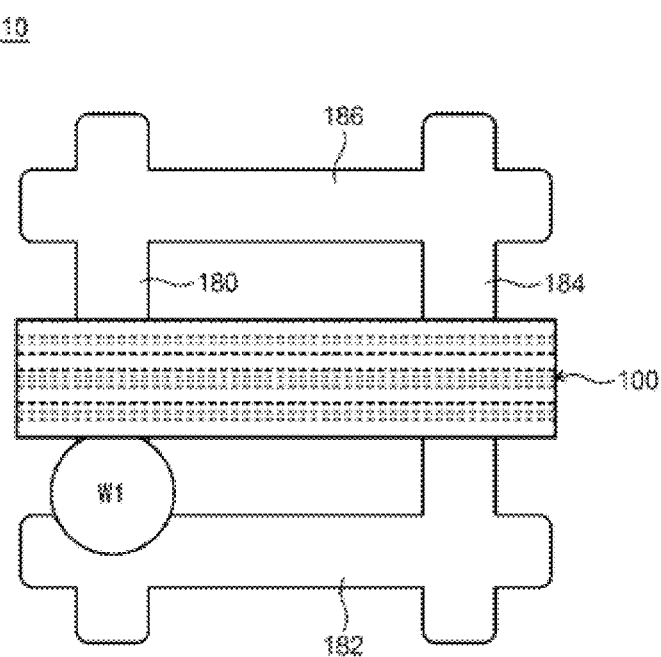

Referring to FIGS. 7A-7B, in the step S100, the deposition target substrate W1 may be moved in a linear direction (D1-direction) such that a first atomic layer is deposit by the gas supply module 100 providing the atomic layer deposition gas on the deposition target substrate W1.

As the deposition target substrate W1 on the first rod 180 is moving in the D1 direction from a location at an upper right of the gas supply module 100 as shown in FIG. 7A, the source gas, the purge gas, the reaction gas and the purge gas may be provided in the spatial division way through a left part of the gas supply module 100. Thus, the first atomic layer may be deposited on the deposition target substrate W1 after passing the deposition target substrate through the gas supply module 100 as shown in FIG. 7B.

Figure 8A:
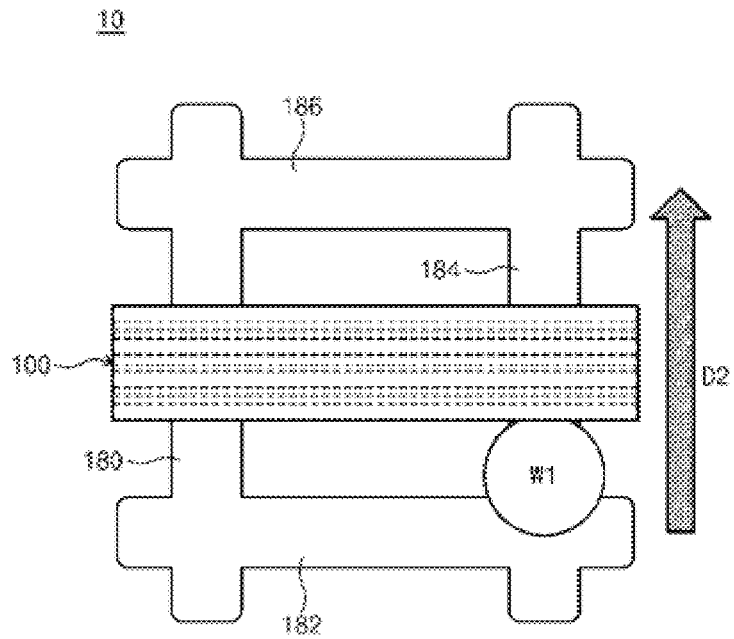
Figure 8B:
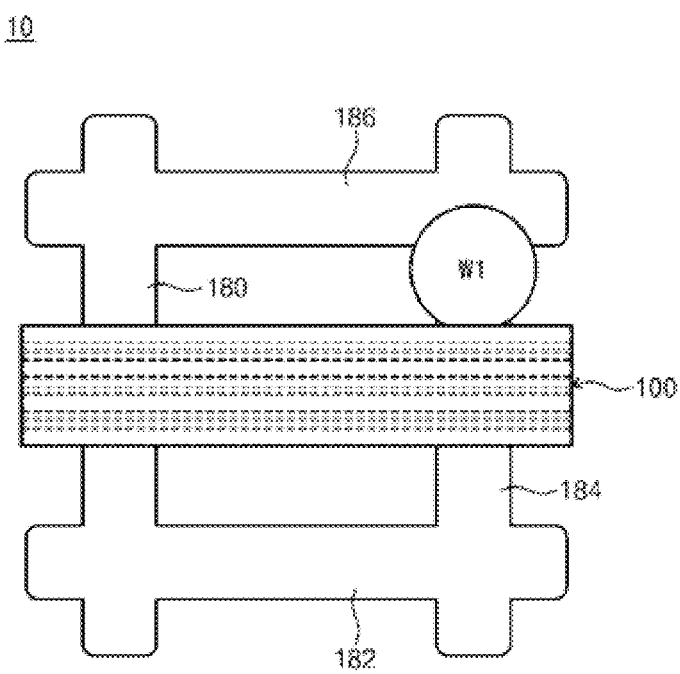

Referring continuously to FIGS. 8A-8B, in the step S110, the deposition target substrate may be further moved in a D2 direction such that the deposition target substrate is located on the third rod 184. The atomic layer deposition gas may be provided on the deposition target substrate W1 passing the right part of the gas supply module 100 to deposit a second atomic layer.

As the deposition target substrate W1 is moving in a D2 direction from a location at a lower right of the gas supply module 100 as shown in FIG. 8A, the source gas, the purge gas, the reaction gas and the purge gas may be provided in the spatial division way through a right part of the gas supply module 100. Thus, the second atomic layer may be deposited on the deposition target substrate W1 after passing the deposition target substrate through the gas supply module 100 as shown in FIG. 8B.

Therefore, the deposition target substrate is moved at 1-cycle along the rods 180, 182, 184 and 186, and thus 2 layers of atomic layers may be deposited on the deposition target substrate W1.

In addition, the deposition target substrate W1 may be provided with the reaction gas in two times while the deposition target substrate W1 receives the source gas at the right part of the gas supply module after receiving the source gas at the left part of the gas supply module, and thus sufficient time may be provided during reaction gas supplying process. Therefore, the high-quality thin film may be provided even if spatial division way is used.

One deposition target substrate is loaded on the stage in the embodiment with reference to FIGS. 7A-7B and 8A-8B for the purpose of ease and convenience in explanation. However, in other embodiments, four deposition target substrates may be loaded on the stage.

Further, the atomic layer deposition apparatus according to the first embodiment of the inventive concepts is used in the atomic layer deposition method according to the first embodiment of the inventive concepts. Alternatively, in other embodiments, the atomic layer deposition method according to the first embodiment of the inventive concepts may use the atomic layer deposition apparatus according to the second or third embodiment of the inventive concepts. If the method uses the atomic layer deposition apparatus according to the second or third embodiment, the deposition target substrate may be moved at 1-cycle along the closed path of the rods to deposit four layers of the atomic layer.

The atomic layer deposition method according to the first embodiment of the inventive concepts was described above with reference to FIGS. 6, 7A, 7B, 8A, and 8B. Hereinafter, an atomic layer deposition method according to a second embodiment of the inventive concepts will be described with reference to FIGS. 9 to 12B.

Figure 9:
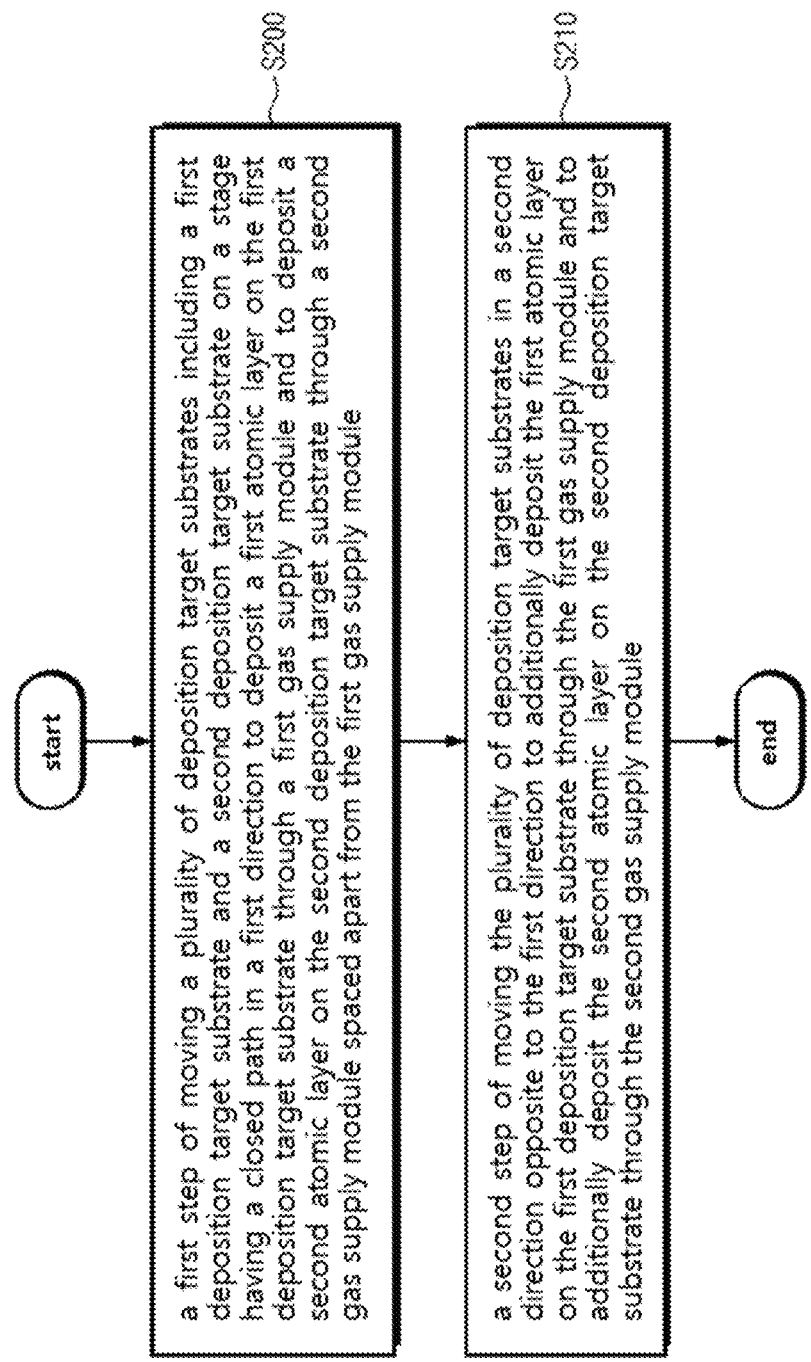
FIG. 9 is a flowchart illustrating an atomic layer deposition method according to a second embodiment of the inventive concepts.

FIG. 9 is a flowchart illustrating an atomic layer deposition method according to a second embodiment of the inventive concepts and FIGS. 10A to 12B are views illustrating the atomic layer deposition method according to the second embodiment of the inventive concepts. Particularly, FIGS. 10A to 12B are views illustrating an atomic layer deposition method according to the second embodiment using the atomic layer deposition apparatus according to the second embodiment of the inventive concepts.

Referring to FIG. 9, the atomic layer deposition method according to the second embodiment of the inventive concepts may include moving a plurality of deposition target substrates including a first deposition target substrate and a second deposition target substrate on a stage having a closed path in a first direction to deposit a first atomic layer on the first deposition target substrate through a first gas supply module and to deposit a second atomic layer on the second deposition target substrate through a second gas supply module spaced apart from the first gas supply module (S200), and moving the plurality of deposition target substrates in a second direction opposite to the first direction to additionally deposit the first atomic layer on the first deposition target substrate through the first gas supply module and to additionally deposit the second atomic layer on the second deposition target substrate through the second gas supply module (S210).

Figure 10A:
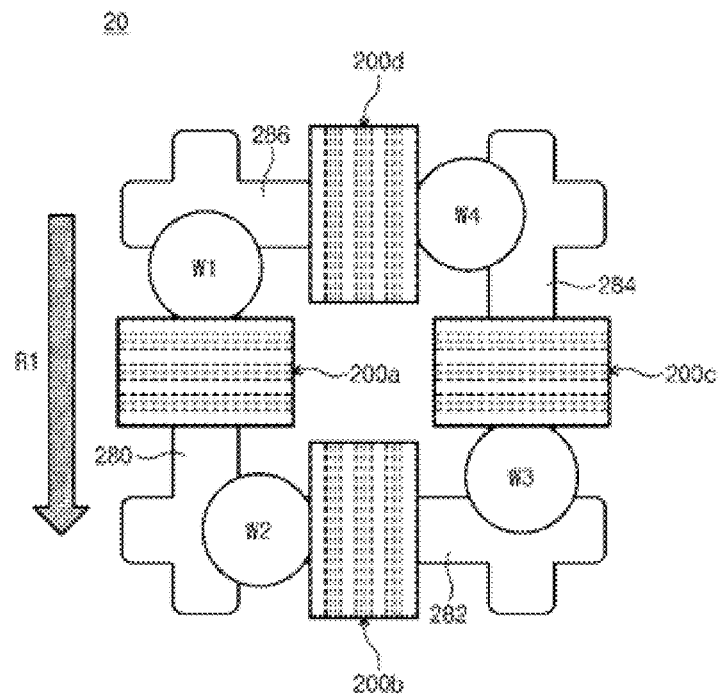
FIGS. 10A, 10B, 11A, 11B. 12A and 12B are schematic views specifically illustrating an atomic layer deposition method according to the second embodiment of the inventive concepts.
Figure 10B:
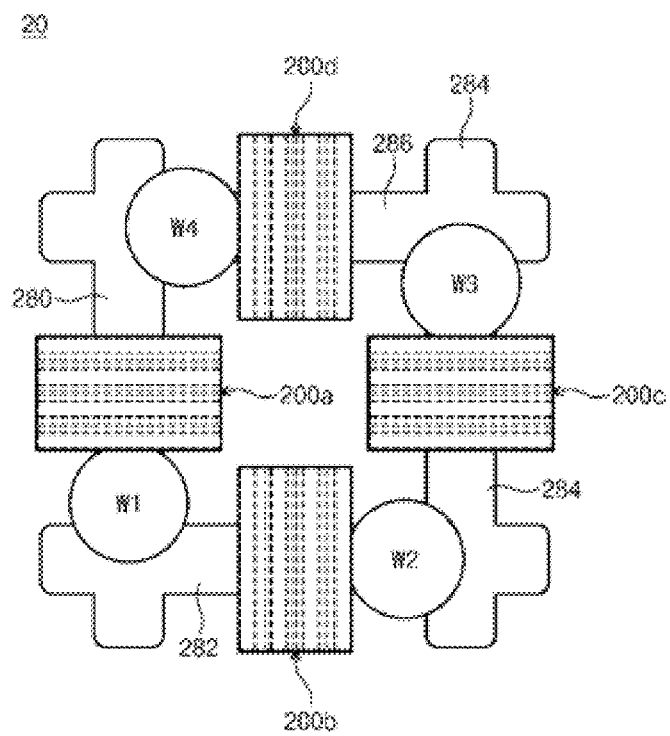

Referring to FIGS. 10A-10B, in the step S200, as the deposition target substrate W1 on the first rod 280 is linearly moving in a first direction (R1 direction, counter clockwise direction), a first atomic layer may be deposited on the first deposition target substrate W1 through the first gas supply module 200a and at the same time, a second atomic layer may be deposited on the second deposition target substrate W2 through the second gas substrate module 200b which is spaced apart from the first gas supply module 200a in a circular direction.

In other words, as the deposition target substrate W1 is linearly moving in the counter clockwise direction from a location at a top side (+Y direction on the basis of the first gas supply module 200a) of the first gas supply module 200a as shown in FIG. 10A, the source gas, the purge gas, the reaction gas and the purge gas may be provided in the spatial division way through the first gas supply module 100. Thus, the first atomic layer may be deposited on the deposition target substrate W1 after passing the deposition target substrate W1 through the first gas supply module 200a as shown in FIG. 10B.

Further, as the deposition target substrate W2 is moving in the counter clockwise direction from a location at a left (−X direction on the basis of the second gas supply module 200b) of the second gas supply module 200b as shown in FIG. 10A, the source gas, the purge gas, the reaction gas and the purge gas may be provided in the spatial division way through the second gas supply module 200b. Thus, the second atomic layer may be deposited on the deposition target substrate W2 after passing the deposition target substrate W2 through the second gas supply module 200b as shown in FIG. 10B. Then, the first and the second atomic layers may be deposited simultaneously.

If the first gas supply module 200a and the second gas supply module 200b spray the same gas, the first and second atomic layers may be the same kind of atomic layers. Alternatively, the first and the second atomic layers may be different kinds of atomic layers if the first gas supply module 200a and the second gas supply module 200b spray different kinds of gases.

In addition, the deposition target substrates W3 and W4 may also be moved along the rods, and thus atomic layers may be deposited on the deposition target substrates W3 and W4.

Figure 11A:
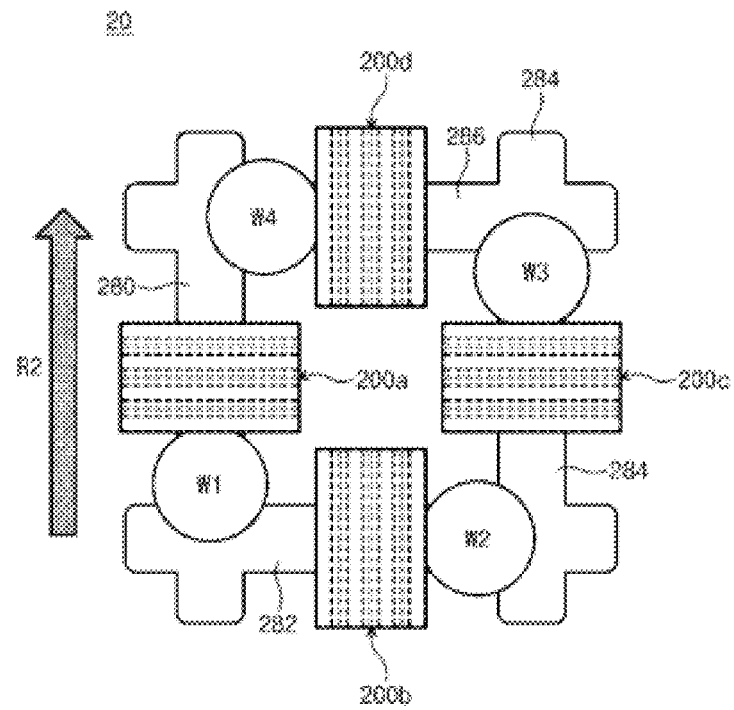
Figure 11B:
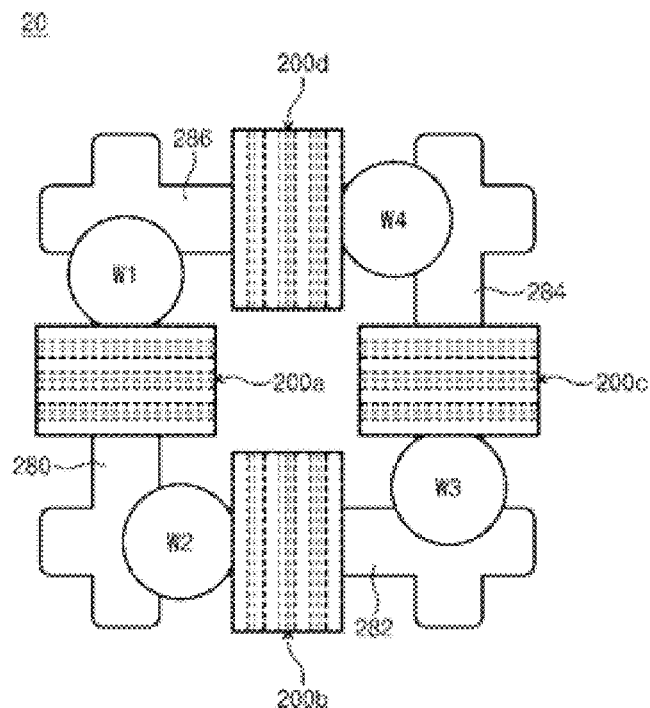

Referring to FIGS. 11A-11B, in the step S210, as the deposition target substrate is moving in a second direction (clockwise direction, R2 direction) opposite to the first direction, the first atomic layer may be additionally deposited on the first deposition target substrate W1 through the first gas supply module and the second atomic layer may be additionally deposited on the second deposition target substrate W2 through the second gas substrate module 200b.

Since the step S210 is performed after the step S200, the first deposition target substrate W1 may pass through the first gas supply module 200a again to additionally deposit the first atomic layer, and the second deposition target substrate W2 may pass through the second gas supply module 200b again to additionally deposit the second atomic layer. The step S210 may be useful when the first gas supply module 200a and the second gas supply module 200b spray different kinds of gases. More specifically, two layers of the first atomic layer may be deposited on the first deposition target substrate W1, and the first atomic layer and the second atomic layer of which kinds are different from each other may be formed on the second deposition target substrate W2. At this time, the first and the second atomic layers which are additionally deposited may be deposited simultaneously.

Thereafter, the step S200 may be repeated such that the first atomic layer is further deposited on the first deposition target substrate W1 and the second atomic layer is further deposited on the second deposition target substrate. This step may be omitted.

Figure 12A:
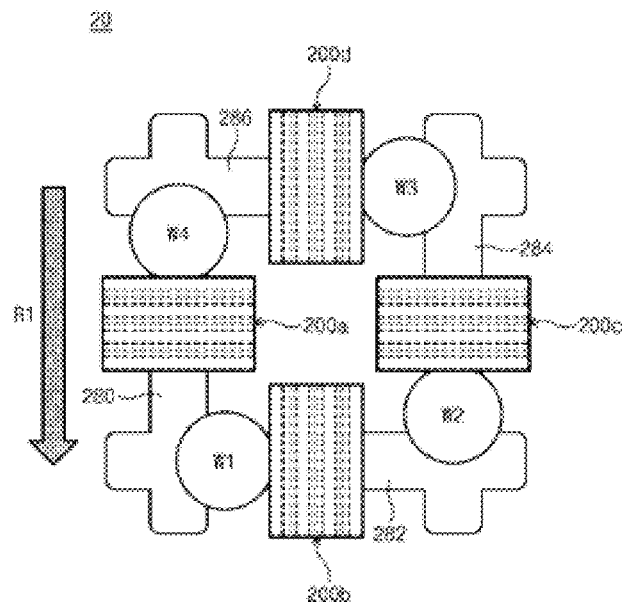
Figure 12B:
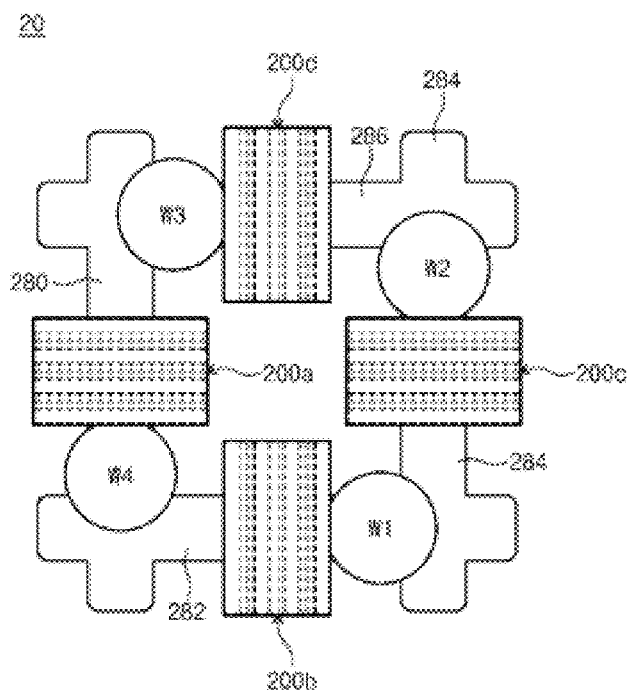

Thereafter, the deposition target substrate may be further moved in the counter clockwise direction (the first direction). Referring to FIGS. 12A-12B, as the deposition target substrate W1 is moving in the counter clockwise direction from a location at a left (−X direction on the basis of the second gas supply module 200b) of the second gas supply module 200b by further moving as shown in FIG. 12A, the source gas, the purge gas, the reaction gas and the purge gas may be provided in the spatial division way through the second gas supply module 200b. Thus, the second atomic layer may be deposited on the deposition target substrate W1 after passing the deposition target substrate W1 through the second gas supply module 200b as shown in FIG. 12B.

Further, as the deposition target substrate W2 is moving in the counter clockwise direction from a location at a bottom side (−Y direction on the basis of the third gas supply module 200b) of the third gas supply module 200c as shown in FIG. 12A, the source gas, the purge gas, the reaction gas and the purge gas may be provided in the spatial division way through the third gas supply module 200c. Thus, a third atomic layer may be deposited on the deposition target substrate W2 after passing the deposition target substrate W2 through the third gas supply module 200c as shown in FIG. 12B. At this time, the third and the second atomic layers may be deposited simultaneously.

The first gas supply module 200a and the third gas supply module 200c may spray the same deposition gas, and the second gas supply module 200b may spray a deposition gas different from that of the first and third gas supply module 200a and 200b. Thus, the first and third atomic layers may be the same kind of atomic layers, and a kind of the second atomic layer may be different from the kind of the first and third atomic layers. The fourth gas supply module 200d may spray the same kind of the deposition gas as the second gas supply module 200b.

The atomic layer deposition method according to the second embodiment of the inventive concepts may provide convenience in that different kinds of atomic layers may be formed easily. The first and third gas supply modules may provide the atomic layer deposition gas of which a kind is different from that of the atomic layer deposition gas provided by the second and fourth gas supply modules. Thus, different kinds of atomic layers may be deposited on the deposition target substrate in one chamber.

Further, for example, the first deposition target substrate may be passed through the second gas supply module after depositing the first atomic layer on the first deposition target substrate by passing and re-passing the first deposition target substrate through the first gas supply module, and thus the second atomic layer of which a kind is different from that of the first atomic layer may be deposited on the first atomic layer. Therefore, a hybrid atomic layer may be deposited. The hybrid atomic layer may compose of a first inorganic layer and a second inorganic layer, or an inorganic layer and an organic layer, or an organic layer and an inorganic layer, or a first organic layer and a second organic layer.

In contrast, the first to fourth gas supply modules 200a, 200b, 200c and 200d may provide respectively different kinds of atomic layer deposition gases, or the first to fourth gas supply modules 200a, 200b, 200c and 200d may provide the same kind of atomic layer deposition gas.

The atomic layer deposition apparatus according to embodiments of the inventive concepts may include the gas supply module simultaneously providing the atomic layer deposition gases including the source gas, the purge gas and the reaction gas on different regions of the deposition target substrate, the stage disposed on a side of the gas supply module and moving the deposition target substrate in a linear direction. At least 2 layers of the atomic layer may be deposited on the deposition target substrate as moving the deposition target substrate in the linear direction along the stage at 1 cycle. In other words, the atomic layer deposition apparatus according to embodiments of the inventive concepts may deposit at least two atomic layers when the deposition target substrate is moved at 1 cycle, and thus productivity may be improved.

In addition, the atomic layer deposition apparatus according to embodiments of the inventive concepts may include the exhaust port which is disposed between the reaction gas supply unit and the purge gas supply unit to exhaust the reaction gas or is disposed between the source gas supply unit and the purge gas supply unit to exhaust the source gas. Thus, the exhaust port according to embodiments of the inventive concepts may minimize the mixture of the atomic layer deposition gases caused by gas current which is occurred by the deposition target substrate moving, thereby providing a thin film with high quality.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An atomic layer deposition apparatus comprising:
a gas supply module for simultaneously providing atomic layer deposition gases comprising a source gas, a purge gas and a reaction gas on different regions of a deposition target substrate; and
a stage disposed on a side of the gas supply module and configured to move the deposition target substrate in a linear direction,
wherein the stage comprises first and third rods linearly extending in a first direction and second and fourth rods linearly extending in a second direction, and the first to fourth rods form a closed path,
wherein the gas supply module passes through a center line of the stage and is formed in a single unitary body between an end and the other end of the stage, and covers the first rod and the third rod in a width direction,
wherein the deposition target substrate moves in one-cycle along the first rod to the fourth rod, and
wherein at least two (2) layers of the atomic layer are deposited on the deposition target substrate as moving the deposition target substrate at the one-cycle in the linear direction along the stage.

2. The atomic layer deposition apparatus of claim 1, wherein the gas supply module comprises: a source gas supply unit for providing the source gas; first and second purge gas supply units, a first outer purge gas supply unit and a second outer purge gas supply unit for providing the purge gas; and first and second reaction gas supply units for providing the reaction gas,
wherein the first outer purge gas supply unit, the first reaction gas supply unit, the first purge gas supply unit, the source gas supply unit, the second purge gas supply unit, the second reaction gas supply unit and the second outer purge gas supply unit are disposed in order along a linear moving path of the deposition target substrate.

3. The atomic layer deposition apparatus of claim 1, wherein the gas supply module comprises a source gas supply unit for providing the source gas, a purge gas supply unit for providing the purge gas, and a reaction gas supply unit for providing the reaction gas,
wherein an exhaust port for exhausting the reaction gas or the source gas is disposed between the reaction gas supply unit and the purge gas supply unit or between the source gas supply unit and the purge gas supply unit.

4. The atomic layer deposition apparatus of claim 3, wherein an exhaust port for exhausting the reaction gas is disposed adjacent to the reaction gas supply unit to exhaust the reaction gas toward an opposite direction from the deposition target substrate, and
wherein an exhaust port for exhausting the source gas is disposed adjacent to the source gas supply unit to exhaust the source gas toward an opposite direction from the deposition target substrate.

5. The atomic layer deposition apparatus of claim 1, wherein the first to fourth rods have a rectangular shape.

6. The atomic layer deposition apparatus of claim 1, wherein the deposition target substrate on each rod moves in respective speeds.

* * * * *